US 9,664,728 B2

(12) United States Patent
Jost et al.

(10) Patent No.: US 9,664,728 B2
(45) Date of Patent: May 30, 2017

(54) DETECTION OF DEFECTIVE ELECTRICAL CONNECTIONS

(71) Applicant: Infineon Technologies Austria AG, Villach (AT)

(72) Inventors: Franz Jost, Stuttgart (DE); Jens Barrenscheen, Munich (DE); Philip Georg Brockerhoff, Munich (DE)

(73) Assignee: Infineon Technologies Austria AG, Villach (AT)

( * ) Notice: Subject to any disclaimer, the term of this patent is extended or adjusted under 35 U.S.C. 154(b) by 831 days.

(21) Appl. No.: 13/862,437

(22) Filed: Apr. 14, 2013

(65) Prior Publication Data

US 2014/0306732 A1 Oct. 16, 2014

(51) Int. Cl.
*G01R 31/02* (2006.01)
*G01R 31/26* (2014.01)
(Continued)

(52) U.S. Cl.
CPC ......... *G01R 31/2607* (2013.01); *H01F 38/30* (2013.01); *H01L 23/5227* (2013.01); *H01L 23/62* (2013.01); *H01L 23/645* (2013.01); *H01L 24/37* (2013.01); *H01L 24/49* (2013.01); *G01K 2217/00* (2013.01); *G01R 15/181* (2013.01); *H01F 2027/408* (2013.01); *H01L 24/32* (2013.01); *H01L 24/45* (2013.01); *H01L 24/48* (2013.01); *H01L 24/73* (2013.01); *H01L 2224/32225* (2013.01); *H01L 2224/37147* (2013.01); *H01L 2224/45147* (2013.01); *H01L 2224/4847* (2013.01); *H01L 2224/49175* (2013.01); *H01L 2224/73263* (2013.01); *H01L 2224/73265* (2013.01); *H01L 2924/00014* (2013.01); *H01L 2924/13055* (2013.01); *H01L 2924/14* (2013.01); *H01L 2924/19042* (2013.01); *H01L 2924/19104* (2013.01);
(Continued)

(58) Field of Classification Search
CPC G01R 31/2632; G01R 31/006; G01R 31/026; G01R 31/2637; H01L 28/20; H01L 29/41741; H01L 29/7395
See application file for complete search history.

(56) References Cited

U.S. PATENT DOCUMENTS 3,719,883 A 3/1973 Pentecost
5,521,513 A 5/1996 Stringer
(Continued)

FOREIGN PATENT DOCUMENTS

CN 2171117 Y 7/1994
CN 2821588 Y 9/2006
(Continued)

OTHER PUBLICATIONS

Microchip PIC18F2455/2550/4455/4550 Data Sheet, available at http://ww1.microchip.com/downloads/en/DeviceDoc/39632D.pdf, p. 5, 2007.*

*Primary Examiner* — Daniel Miller
(74) *Attorney, Agent, or Firm* — Slater Matsil, LLP (57) ABSTRACT

An embodiment relates to an integrated circuit comprising at least two electrical connections and at least one coil arranged adjacent to at least one of the electrical connection, wherein the at least one coil each comprises at least one winding and wherein the at least one coil is arranged on or in the integrated circuit.

19 Claims, 5 Drawing Sheets

(51) Int. Cl.
    *H01L 23/64*     (2006.01)
    *H01L 23/522*     (2006.01)
    *H01L 23/62*     (2006.01)
    *H01F 38/30*     (2006.01)
    *H01L 23/00*     (2006.01)
    *G01R 15/18*     (2006.01)
    *H01F 27/40*     (2006.01)

(52) U.S. Cl.
    CPC ............ *H01L 2924/30107* (2013.01); *H01L 2924/351* (2013.01)

(56) References Cited

U.S. PATENT DOCUMENTS

| | | | |
|---|---|---|---|
| 5,963,038 | A | 10/1999 | De Jong |
| 7,483,248 | B1 * | 1/2009 | Ho .................. G01R 19/16552 324/127 |
| 2003/0214313 | A1 | 11/2003 | Omura et al. |
| 2007/0215973 | A1 | 9/2007 | Rahman et al. |
| 2007/0252011 | A1 | 11/2007 | Ferreira et al. |
| 2008/0206908 | A1 * | 8/2008 | Walter ............... G01R 31/2831 438/18 |
| 2008/0221779 | A1 | 9/2008 | Augesky et al. |
| 2011/0101498 | A1 | 5/2011 | Hayashi |

FOREIGN PATENT DOCUMENTS

| | | |
|---|---|---|
| CN | 1906555 A | 1/2007 |
| CN | 101278114 A | 10/2008 |
| WO | 2013044965 A1 | 4/2013 |

* cited by examiner

DETECTION OF DEFECTIVE ELECTRICAL CONNECTIONS

BACKGROUND OF THE INVENTION

Embodiments of the present invention relate to integrated circuits, in particular electrical connections to an integrated circuit, i.e. a copper clip or a bonding wire connecting a chip (die) with external pins. In order to share the current load, several electrical connections can be arranged in a parallel connection. However, if one of the electrical connections to the integrated circuit becomes defective, breaks or comes off, the current to the integrated circuit is conveyed across the remaining electrical connections, which may eventually inflict damage to the circuit and may thus lead to a malfunction of a module or device in which the integrated circuit is embedded.

SUMMARY

A first embodiment relates to an integrated circuit comprising at least two electrical connections and at least one coil arranged adjacent to at least one of the electrical connections, wherein the at least one coil each comprises at least one winding and wherein the at least one coil is arranged on or in the integrated circuit.

The integrated circuit refers to a semiconductor device optionally comprising passive components bonded to a substrate or circuit board. The integrated circuit may also refer to a chip or piece of silicon, e.g., die, that is connected to pins of, e.g., a chip housing.

The coil may in particular comprise one winding or more windings; the coil is preferably open so that a voltage can be determined at the end of the coil; such voltage may be based on electromagnetic induction. The current flowing through the electrical connection changes the magnetic fields in its vicinity; this change can be detected by said coil, which provides a voltage based on change of the current. If one of the connections suddenly breaks down, this leads to a change of the current, which can be detected and further processed via said at least one coil.

It is noted that "parallel connection" as referred to herein be directed to connections that are electrically connected in parallel with each other, i.e. such that a current divides into several (equal) portions of current, each such portion being conveyed across one of the (intact) parallel connections.

A second embodiment relates to a device for determining a defective electrical connection to an integrated circuit, wherein the device is arranged for determining a current change in several parallel electrical connections via a voltage that is induced in at least one coil located in the vicinity of the electrical connections and for determining which of the several parallel electrical connections is defective based on the voltage induced in the at least one coil.

A third embodiment relates to a method for determining a defective electrical connection to an integrated circuit, wherein a current change in several parallel electrical connections via a voltage that is induced in at least one coil located in the vicinity of the electrical connections is determined, and wherein it is determined which of the several parallel electrical connections is defective based on the voltage induced in the at least one coil.

A forth embodiment is directed to a device for determining a defective electrical connection to an integrated circuit, comprising a comparing means for comparing a signal from at least one coil that is arranged adjacent to at least one electrical connection to an integrated circuit with a reference signal, and comprising a processing logic that is connected to the output of the comparing means, wherein the processing logic provides an output signal dependent on a voltage induced in the at least one coil.

A fifth embodiment relates to a system for determining a defective electrical connection comprising several electrical connections that are connected to an integrated circuit in parallel, comprising at least one coil that is arranged on or in the integrated circuit adjacent to at least one of the several electrical connections, and comprising a device for determining a defective electrical connection among the several electrical connections, wherein the device is arranged for determining a current change in at least one of the parallel electrical connections via a voltage that is induced in the at least one coil by at least one adjacent electrical connection, and for determining which of the several parallel electrical connections is defective based on the voltage induced in the at least one coil.

A sixth embodiment is directed to a system for determining a defective electrical connection to an integrated circuit comprising means for determining a current change in several parallel electrical connections via a voltage that is induced in at least one coil located in the vicinity of the electrical connections, and means for determining which of the several parallel electrical connections is defective based on the voltage induced in the at least one coil.

A seventh embodiment relates to a system for determining a defective electrical connection comprising several electrical connections that are connected to several integrated circuits, at least one coil that is arranged adjacent to at least one of the electrical connections, a device for determining a defective electrical connection among the several electrical connections. This device is arranged for determining a current change in at least one of the electrical connections via a voltage that is induced in the at least one coil by at least one adjacent electrical connection, and for determining which of the several parallel electrical connections is defective based on the voltage induced in the at least one coil.

The electrical connection could be applied to one integrated circuit (e.g., chip or die) or several integrated circuits, wherein the several integrated circuits are electrically connected in parallel to each other. This allows determining a current change between several integrated circuits. It is also an option that each connection to each of these integrated circuits comprises at least one, in particular several, bonding wires.

BRIEF DESCRIPTION OF THE DRAWINGS

Embodiments are shown and illustrated with reference to the drawings. The drawings serve to illustrate the basic principle, so that only aspects necessary for understanding the basic principle are illustrated. The drawings are not to scale. In the drawings the same reference characters denote like features.

DETAILED DESCRIPTION OF THE PREFERRED EMBODIMENTS

A voltage is induced if an absolute value of the current change is larger than zero, i.e. abs(di/dt)>0 and at least a part of the resulting magnetic field interacts with the coil. For example, bond connections on a chip carry current parallel to the chip surface at least over a short distance (the current may thus not enter or leave the chip at a single point). Hereinafter, the expression "carry a current" implies that a change of the current (di/dt) occurs in the connection.

Power semiconductors, e.g., power switches or circuit breakers, are electrically connected via copper clips or bonding wires. In order to allow for high current to flow via such connection, several connections, in particular bonding wires, are used in parallel on a chip. The quality of the electrical connection is important for a high ampacity. The connection may be subject to several parameters, e.g., a current that can be conveyed via the connection,
thermal conductivity,
contact resistance.

One major reason for a deficient connection and thus the malfunction of a circuit is based on a physical deterioration, e.g., damage of at least one bonding wire detaching the connection to the chip, e.g., due to thermal stress over a large amount of switching cycles or due to wire break.

Thus a solution is presented that allows detecting a deterioration or a failure of a bonding wire by determining the change of a current flowing through several bonding wires that are arranged in parallel. If one of the bonding wires becomes defective (e.g., breaks or off), the current disperses among the remaining bonding wires. This may result in a failure of the chip as a higher current is to be conveyed across less remaining bonding wires, which may not be designed to carry such high current.

Detecting a defective bonding wire or connection in general allows initiating counter-measures in time before an actual failure occurs. For example, a safe state may be entered by shutting down the device or a portion thereof. As an alternative, a current to be conveyed across the defective bonding wires may be reduced in order to avoid a malfunction of the circuit. In addition, the detection of the failure allows providing feedback, e.g., "defective bonding wire in module A, chip B" or the like, which substantially simplifies fault diagnosis, replacement and/or repair of a circuit or device.

The solution presented in particular utilizes detecting a change in the magnetic field around the bonding wires. Such change of the magnetic field can be detected by at least one coil or loop.

It is noted that the expressions loop and coil can be used interchangeably. The coil as well as the loop may have at least one winding. At the end of the loop or coil a voltage can be determined based on electromagnetic induction. It is also an option to provide several coils for detecting the change in the magnetic field, each of said coils having at least one winding.

Furthermore, the bonding wire referred to herein is one example as how to electrically connect a chip or piece of silicon; other electrical connections, e.g., clips of conductive material, e.g., copper, could be used accordingly.

For example, two coils (each with at least one winding) may be placed on the chip adjacent to the bonding wires. Due to the magnetic induction principle, if the current is distributed evenly (in case the bonding wires are well connected and in order) the resulting voltage in the coils (substantially) amounts to zero. If one of the bonding wires comes off, the induction voltage significantly changes thereby allowing detection of such defective state.

Figure 1:
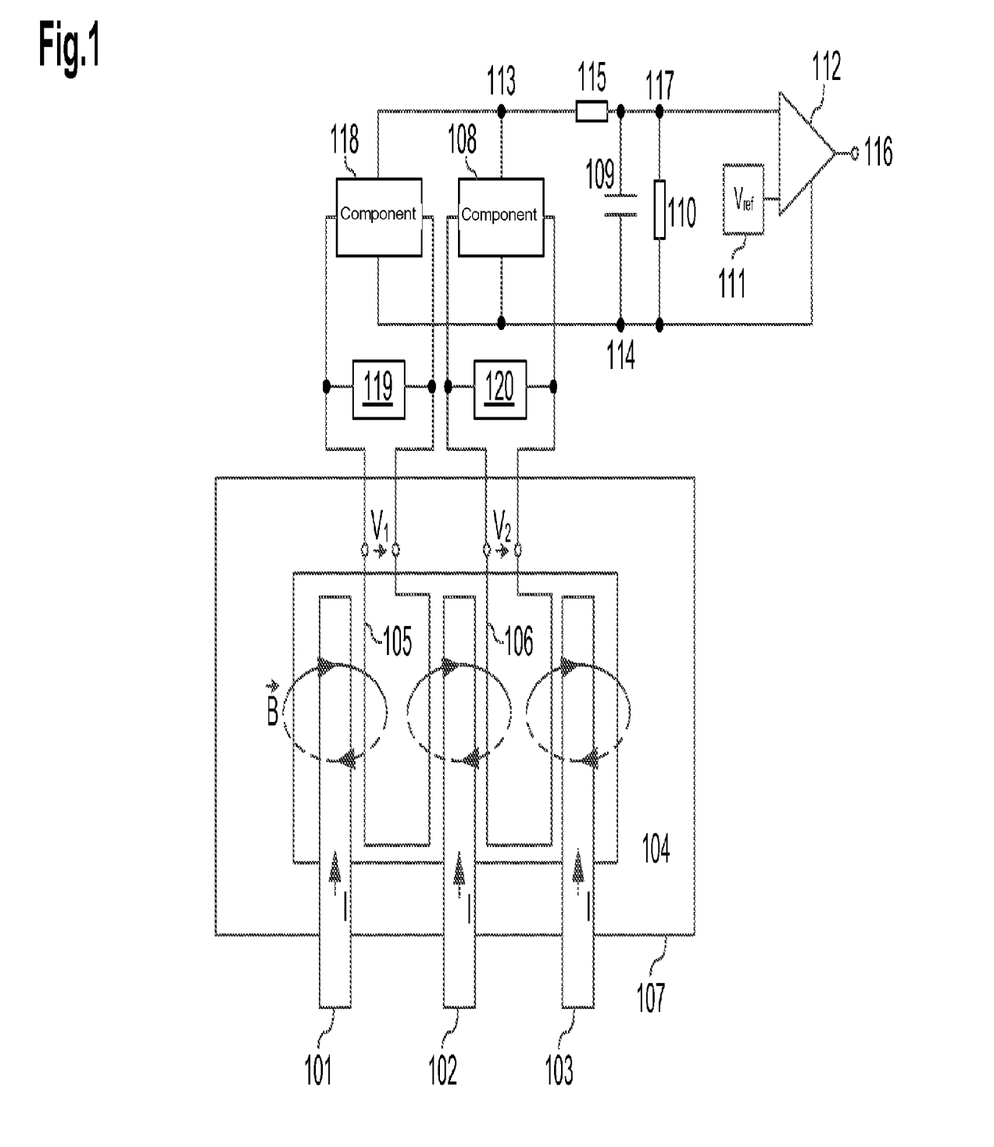
FIG. 1 shows a schematic arrangement of bonding wires located within a contact area of a chip and a processing circuitry for producing an output signal based on voltages induced in coils arranged adjacent to said bonding wires.

FIG. 1 shows a schematic arrangement of bonding wires 101, 102 and 103 located within a contact area 104 of a chip 107. A coil 105 is located in the area 104 between the bonding wires 101 and 102 and a coil 106 is located in the area 104 between the bonding wires 102 and 103. Each of the coils 105, 106 can comprise at least one winding. The coil 105, 106 can in particular be realized as a measuring loop.

The coil 105 is connected to a component 118 comprising a rectifier and an amplifier, which supplies a signal derived from the coil 105 after an appropriate signal conditioning to nodes 113 (positive pole) and 114 (negative pole). Accordingly, the coil 106 is connected to a component 108 that may comprise an amplifier, a filter or a rectifier, which supplies a signal derived from the coil 106 after an appropriate signal conditioning to the nodes 113 and 114. The rectifiers can be implemented as bridge or Graetz rectifiers.

The node 113 is connected via a resistor 115 to a node 117. The node 117 is connected to the first input of a comparing element 112, e.g., a comparator or operational amplifier. The second input of the comparing element 112 is connected to a reference voltage $V_{ref}$ 111. The node 117 is also connected via a capacitor 109 to the node 114. Also, the node 117 is connected via a resistor 110 to the node 114, wherein said resistor 110 preferably has a substantially larger resistance than the resistor 115. The node 114 is also fed to the comparing element 112 as a reference potential. The comparing element 112 supplies a result of the comparison via an output 116, which allows detecting that a bond connection does not work correctly.

If the electrical connection of the bonding wires 101 to 103 is intact, the current distributes evenly across these bonding wires 101 to 103, i.e. each of the bonding wires carries (substantially) the same amount of current I. In such scenario, a voltage $V_1$ detected by the coil 105 amounts to (substantially) zero. This holds true for a voltage $V_2$ detected by the coil 106.

If one of the bonding wires 101 to 103 becomes inoperative and does no longer carry the same amount of current I, the current distribution across the bonding wires 101 to 103 changes, which induces a voltage in at least one of the coils 105 or 106 (depending on the actual bonding wire that is subject to the failure). Based on this voltage induced, a change of the current distribution among the bonding wires can be detected and the voltage induced can be used as an error signal for further processing.

This approach can also be utilized to determine a number of defective bonding wires. Based on such number, a decision can be made how to proceed, in particular control a switching element. For example, no action may be required as long as a predetermined number of parallel bonding wires is/are intact. In some applications it is sufficient to become aware of a defective connection. Depending on the signal conditioning and the treatment of the coils' signals, it is possible to detect which connection is defective or to combine all the local error signals to a common error signal.

A temperature measurement unit 119 can be provided in parallel to the component 118 to detect the voltage induced in the coil 105 and determine a temperature information based on such voltage. The coil 105 can be used for temperature measurement purposes by monitoring an alteration of the coil's resistance (which depends on the temperature). Such temperature measurement is preferably conducted when there is no change in the current flowing through the bonding wires. Accordingly, a measurement unit 120 can be provided in parallel to the component 108 to detect the voltage induced in the coil 106 and determine a temperature information based on such voltage.

It is also an option to combine the measurement units 119 and 120 into a single unit which is connected to each of the coils 105 and 106. It is another option that the measurement unit issues an alarm signal or applies a control signal in case a temperature reaches or exceeds a predefined threshold.

Figure 5:
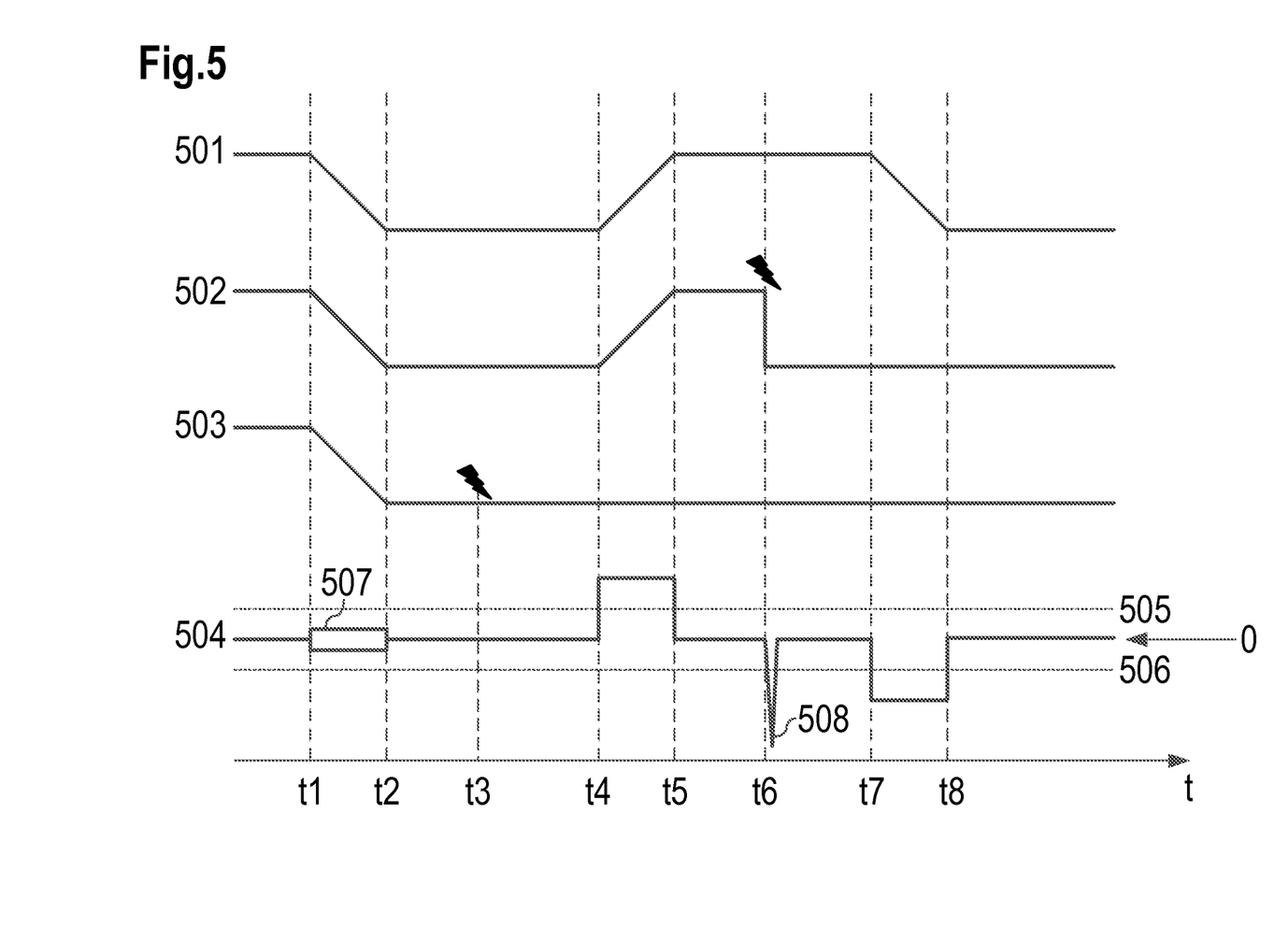
FIG. 5 shows a timing diagram comprising a signal at the output of the comparing element of FIG. 1 together with a current signal through the bonding wires as shown in FIG. 1.

FIG. 5 shows a timing diagram comprising a signal 504 representing a combination of the induced voltages $V_1$ and $V_2$ by the coils 105 and 106 as shown in FIG. 1, which can be used to generate a signal at the output 116 of the comparing element 112. Also shown in this timing diagram are a current signal 501 through the bonding wire 101, a current signal 502 through the bonding wire 102 and a current signal 503 through the bonding wire 103 over time t. The bonding wires 101 to 103 are electrically coupled in parallel; hence if all bonding wires 101 to 103 are intact, they should carry substantially the same amount of current. The bonding wires 101 to 103 can be, e.g., connected to a pin of an integrated circuit, which is exemplarily referred to as "the connection". In the example of FIG. 5 it is assumed that current is conveyed to the connection either at a high value or at a low value. The low value is exemplarily zero, i.e. no current is conveyed. However, the current may be conveyed to or from this connection and it may have other values than high or zero.

At a time t1, the current through the connection changes from high to zero. Such change takes some time indicated by the time interval between the time t1 and a time t2. Prior to the time t1, the signals 501 to 503 have the same value, hence the signal 504 amounts to zero. Due to asymmetries in the coupling of coils to the different bonding wires 101 to 103, the current change from high to zero does not result in identical current signals 501 to 503 between t1 and t2, which leads to some fluctuation 507 of the signal 504 during this time interval. However, the bonding wires 101 to 103 are assumed to still be intact and the fluctuation 507 of the signal 504 indicated between t1 and t2 is below an upper threshold 505 and above a lower threshold 506, i.e. within a band defined by the upper threshold 505 and the lower threshold 506.

At a time t3, the bonding wire 103 comes off (i.e. becomes defective) and can no longer carry any current to or from the connection. As none of the bonding wires 101 to 103 carry any current at the time t3, this defect of the bonding wire 103 does not immediately become apparent.

However, at a time t4 the current is switched to high and the current starts flowing to the connection, but only via the bonding wires 101 and 102 (as bonding wire 103 became defective at the time t3, the signal 503 stays at zero). Due to the circuitry shown in FIG. 1, a substantially higher voltage is induced in the coil 106, because the bonding wire 103 can no longer contribute any induced voltage (which would otherwise have reduced or compensated the voltage $V_2$ induced in the coil 106). Hence, the signal 504 is higher than the threshold 505 during the time interval between the time t4 and a time t5. Starting at the time t5 the current change in the connection has ended and the high value of the current is reached (conveyed only via the bonding wires 101 and 102).

At a time t6 the bonding wire 102 becomes defective, which due to the high value of the current carried via the bonding wires 101 and 102 to the connection, leads to an abrupt change of current in bonding wire 102 and thus to a peak voltage induced in the coil 105 which appears as a peak 508 in the signal 504. The peak 508 is outside the band defined by the upper and lower thresholds 505 and 506 and can thus be identified as a defect.

At a time t7 the current to the connection commences to return from high to zero. In this example, only bonding wire 101 is still properly connected and conveying any change of current. As described above, the current takes from the time t7 to a time t8 to return to zero. The change of current in the signal 501 induces a voltage in the coil 105 with no compensation of a current flowing through the bonding wire 102 (or bonding wire 103). Hence, this voltage induced leads to the signal 504 exceeding the lower threshold 506.

The signal 504 exceeding (i.e. being higher than) the upper threshold 505 or exceeding (i.e. being lower than) the lower threshold 506 indicates that a defect occurred in at least one of the bonding wires 101 to 103. It could also be determined, how many defects occurred and/or which of the bonding wires is damaged.

Figure 2:
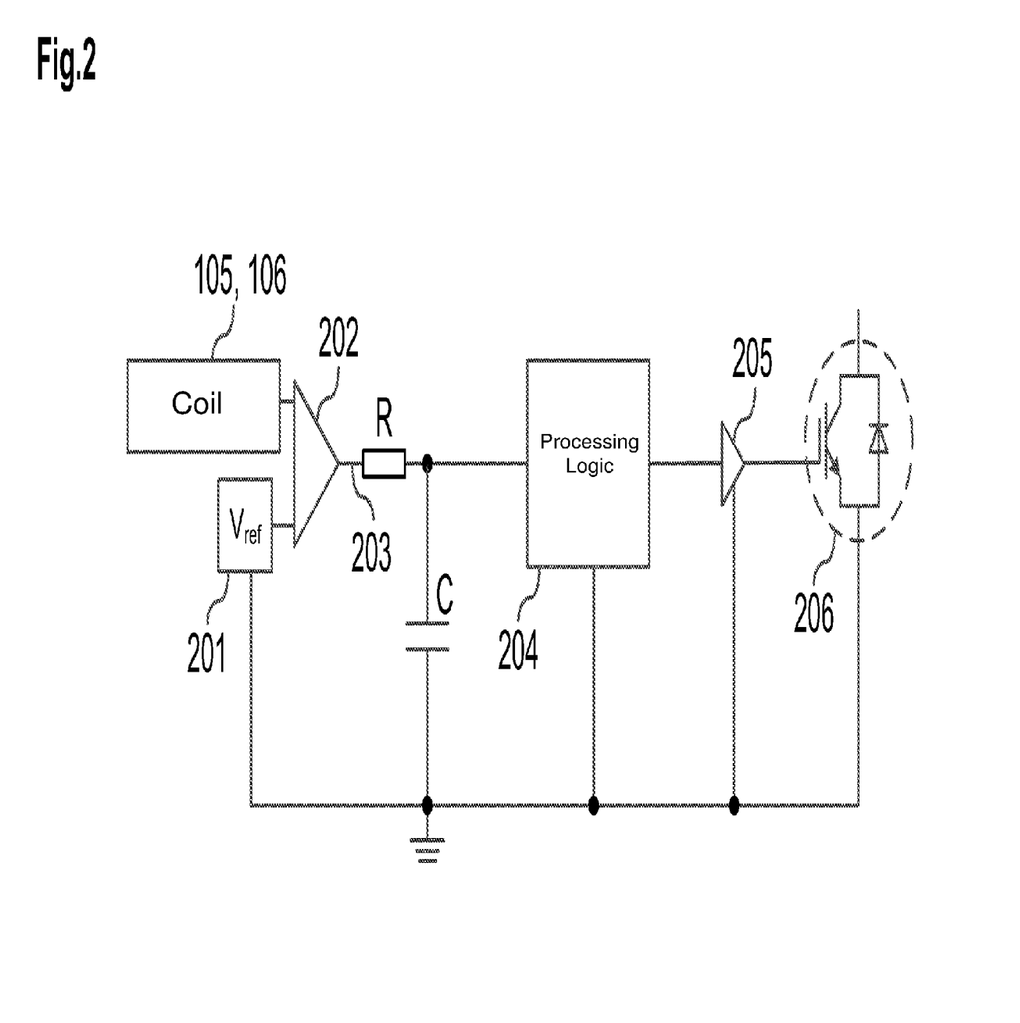
FIG. 2 shows an exemplary circuit diagram for measuring and processing the signals detected by the coils.

FIG. 2 shows an exemplary circuit diagram for measurement purposes. The signal of the coils 105, 106 is fed to a first input of a comparator 202. A reference signal $V_{ref}$ 201 is fed to a second input of the comparator 202. The output of the comparator 202 provides an error signal 203 that is fed via a RC element (low pass) to a processing logic 204 and further via a driver 205 to a switching element 206, e.g., a circuit breaker. The switching element 206 can thus be switched off based on the error signal 203. The reference signal Vref 201 is supplied via a local ground reference potential (also referred to as ground), the capacitor of the RC element is connected with one pin to ground, the processing logic 204 and the driver 205 are connected to ground as reference potential and the emitter of the switching element 206 is connected to ground.

In case the voltage at both coils 105 and 106 is measured, it can be determined which of the bonding wires 101 to 103 came off. If the bonding wires 101 to 103 are intact, the following relationship applies:

$$V_1 = V_2 = 0V.$$

In case the bonding wire 101 comes off, the relationship changes to $$V_1 \neq 0$$

and in case the bonding wire 103 comes off, the relationship changes to $$V_2 \neq 0.$$

In case the bonding wire 102 in the middle comes off, the relationship above changes to $$V_1 \neq 0 \text{ and } V_2 \neq 0.$$

It is noted however, that "equals zero" comprises also the case where the respective voltage substantially equals zero in a less restrictive manner. However, if a bonding wire comes off, the voltages change compared to the intact scenario. Such change can be clearly detected utilizing at least one measurement circuit according to FIG. 2. In particular "equals zero" may comprise a scenario "equals a predefined value" depending on the particular use case. For example, due to other (more or less) adjacent bonding wires in the vicinity of the bonding wires 101 to 103, side effects may induce a voltage into the coils 105 and 106. Also, the environment or surroundings of the circuit may induce a voltage different from zero. However, the voltage change described herein based on the fact that a bonding wire becomes defective may be detected based on the amount of voltage induced (the change of the magnetic field) and provides a reliable error signal rather independent from the environment in which the circuit is employed.

The approach presented may be extended to more than three bonding wires and/or to different arrangement of bonding wires.

As an option, the coil can be used for temperature measurement. In such case, the alteration of the coil's resistance (which depends on the temperature) is monitored. Temperature measurement is preferably conducted when there is no change in current flowing through the bonding wires. As the wire of the coil changes its resistance with its temperature, temperature measurement can be conducted using said coil.

A temperature measurement may be conducted when the current does not change, i.e. while di/dt=0. Hence, no voltage is induced in the coil.

As indicated that change of the magnetic field within the area surrounded by the coil is measured. Hence, the coil works like a current transformer without core. The voltage measured may be estimated based on the following exemplary values:

$di/dt=100$ A/µs; $\mu_r=1$; $L=1$ mm; $H=2$ mm; $r=1$ mm, wherein di/dt is a change of current over time, $\mu_r$ is the relative permeability, L is the length of the coil, H is the height of the coil and r is the distance from the bonding wire. The above leads to a measurement area S amounting to $S=2\cdot10^{-6}$ m$^2$ The voltage in the coil thus amounts to $$E = -\frac{dB}{dt} \cdot S$$
$$= \mu_o \mu_r \frac{di}{dt 2\pi r} \cdot S$$
$$= 4\cdot10^{-7} \frac{100}{10^{-6}} \cdot \frac{2\cdot10^{-6}}{2\pi 10^{-3}} V$$
$$= 40 \text{ mV}$$

Hence, the solution presented herein in particular provides a coil which can be located on or in the silicon of a chip or on the direct copper bond (DCB) board in order to detect a change in the magnetic field based on a change in the current flowing through several electrically parallel connected bonding wires. This allows determining the state of the bonding wires and provides an error signal in case one of the parallel bonding wires is defective. The change in the magnetic field induces a voltage into the loop, which can be detected and further processed as error signal.

Figure 3:
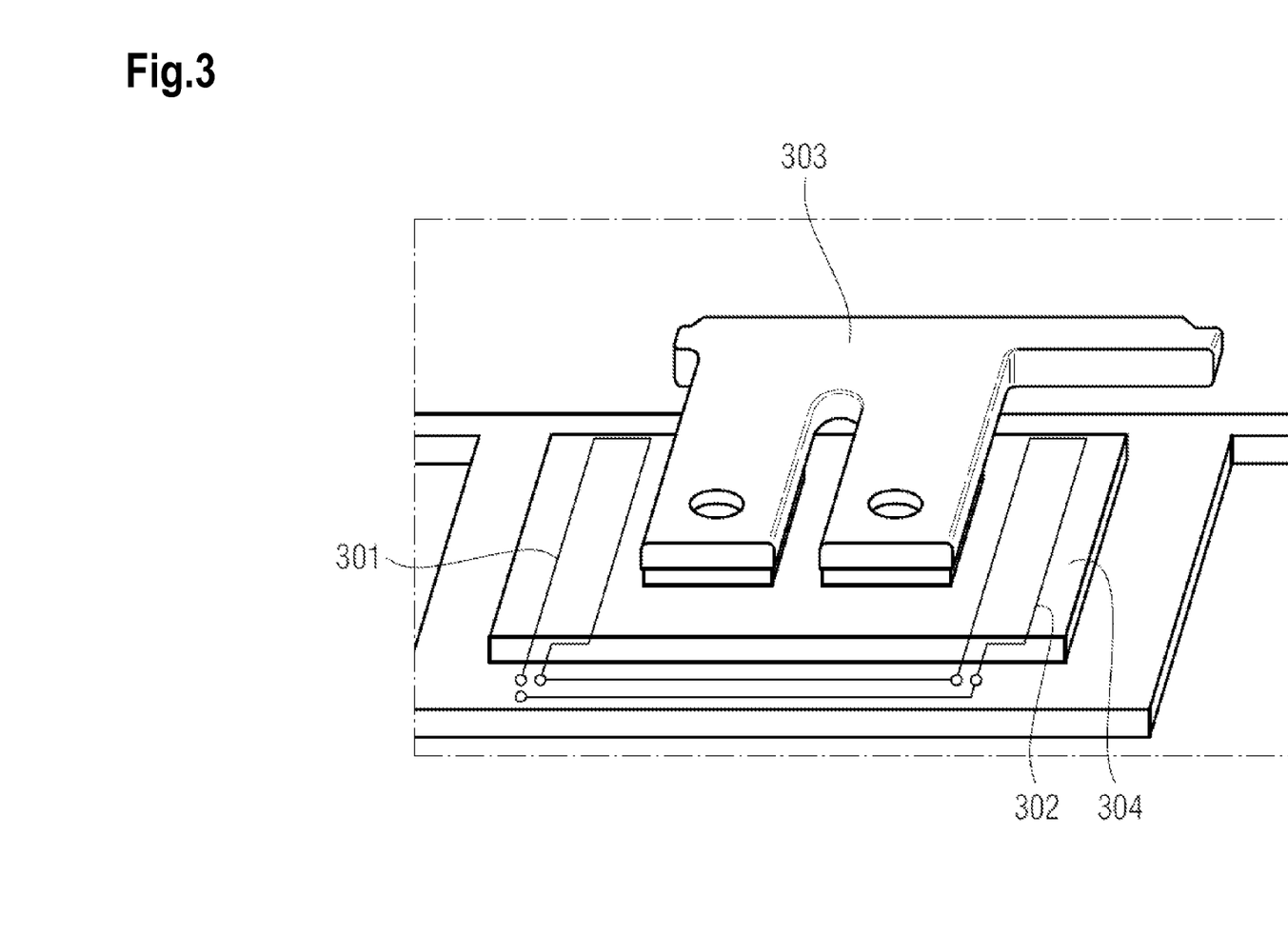
FIG. 3 shows an exemplary implementation comprising coils arranged on two sides of a bonding in a planar manner.
Figure 4:
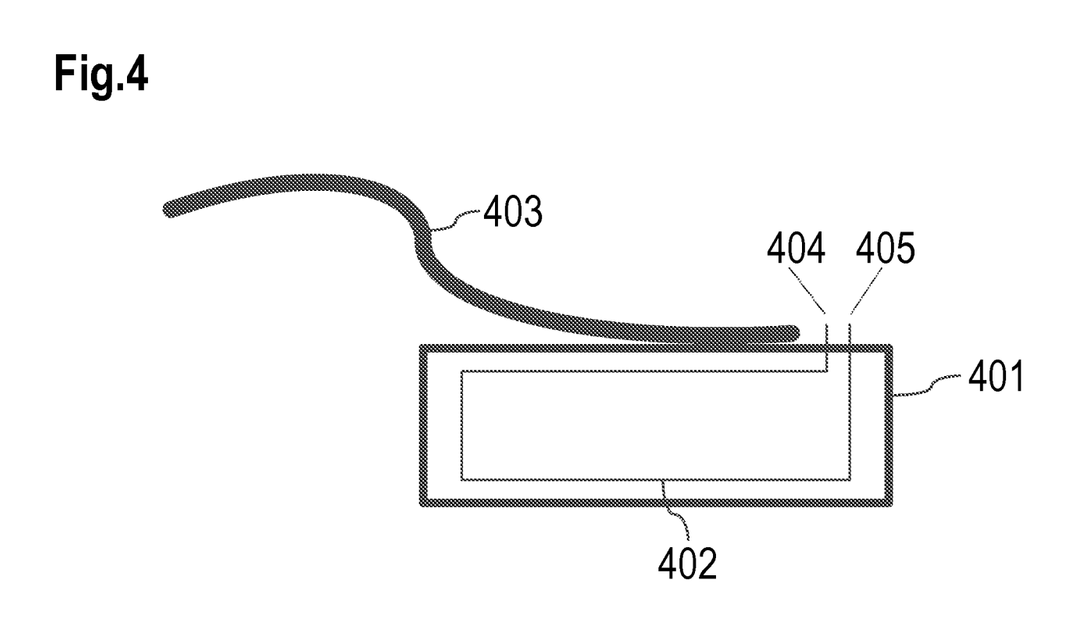
FIG. 4 shows an exemplary diagram of a lateral view of an integrated circuit with a loop arranged on a side of the chip or in parallel to a side of the chip.

FIG. 4 shows an exemplary diagram of a lateral view of an integrated circuit or chip 401 with a loop 402 arranged on a side of the chip 401 or (substantially) in parallel to a side of the chip. The loop 402 can be provided by trench technology. FIG. 3 also shows a bonding wire 403 connected to the chip 401. The loop 402 can be electrically connected using vias. A voltage induced in the loop 402 can be determined at its pins 404 and 405.

As an option, the coil can be used to measure the temperature on the chip based on its resistive characteristics over temperature.

FIG. 3 shows an exemplary implementation. A coil 301 can be arranged on one side of a bonding 303 in a planar manner and a coil 302 can be arranged on the other side of the bonding 303 in a planar manner. The bonding 303 is placed on a chip 304. It is noted that the coils 301 and 302 may be arranged in the chip as well. They may be located in a planar or in a perpendicular manner or anything in-between.

For example, the coils can be arranged perpendicular to the surface of the chip, e.g., via trench technology. The error signal can be led through by a via or an auxiliary emitter and an additional pin.

The output signal of the coils can be amplified by using several windings.

The coil can be realized as a micro coil. The micro coil can be mounted in or on a chip. Details about micro coils can be found at www-matee.tuberlin.de/research/microcoil/coil.htm.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Further, the methods of the invention may be achieved in either all software implementations, using the appropriate processor instructions, or in hybrid implementations that utilize a combination of hardware logic and software logic to achieve the same results. Such modifications to the inventive concept are intended to be covered by the appended claims.

The invention claimed is:

1. A device for determining a defective electrical connection to an integrated circuit,
    wherein the device comprises a first coil and a second coil,
    wherein the first coil is located between or adjacent to a first electrical connection and a second electrical connection,
    wherein the second coil is located between or adjacent to the second electrical connection and a third electrical connection,
    wherein the first electrical connection, the second electrical connection and the third electrical connection are arranged in parallel,
    wherein the device is arranged
        for determining a current change in the first electrical connection or in the second electrical connection via a first voltage that is induced in the first coil,
        for determining a current change in the second electrical connection or in the third electrical connection via a second voltage that is induced in the second coil, and
        for determining which of the parallel electrical connections is defective based on the first voltage and the second voltage.

2. The device according to claim 1, wherein the device is arranged for issuing a signal based on the defective electrical connection determined indicating or comprising at least one of the following:
    which of the parallel electrical connections is defective;
    an alarm notification;

an indication that a current has to be limited or reduced, in particular a signal to reduce or limit the current conveyed to the remaining electrical connection(s);
an error signal; and
a control signal for switching off a component, in particular an electronic switch, transistor, IGBT or FET.

3. The device according to claim 1, wherein the device is arranged to conduct a temperature measurement based on the change in a resistance of the first coil or the second coil.

4. The device according to claim 3, wherein the device is arranged to conduct the temperature measurement during a phase when the current change through the parallel electrical connections is zero or is substantially zero.

5. The device according to claim 1, wherein the first coil or the second coil is utilized as a current transformer, in particular a current transformer without core.

6. The device according to claim 1, wherein the device is arranged for determining which of the parallel electrical connections is defective based on the first voltage or the second voltage, wherein the first voltage induced in the first coil or the second voltage induced in the second coil in the vicinity of the defective electrical connection differs from zero or provides a variation that is larger than a predetermined value.

7. The device according to claim 1, wherein a number is determined of the parallel electrical connections that is or are defective.

8. A method for determining a defective electrical connection to an integrated circuit, wherein the integrated circuit comprises a first coil and a second coil, the first coil is located between or adjacent to a first electrical connection and a second electrical connection, the second coil is located between or adjacent to the second electrical connection and a third electrical connection, and the first electrical connection, the second electrical connection and the third electrical connection are arranged in parallel, the method comprising:
determining a current change in the first electrical connection or in the second electrical connection via a first voltage that is induced in the first coil,
determining a current change in the second electrical connection or in the third electrical connection via a second voltage that is induced in the second coil, and
determining which of the parallel electrical connections is defective based on the first voltage and the second voltage.

9. The method according to claim 8, further comprising issuing a signal based on the determined defective electrical connection indicating or comprising at least one of the following:
which of the parallel electrical connections is defective;
an alarm notification;
an indication that a current has to be limited or reduced, in particular a signal to reduce or limit the current conveyed to the remaining electrical connection(s);
an error signal; and
a control signal for switching off a component, in particular an electronic switch, transistor, IGBT or FET.

10. The method according to claim 8, further comprising measuring a temperature based on the change in a resistance of the first coil or the second coil.

11. The method according to claim 10, wherein the measuring the temperature measurement is performed during a phase when the current change through the parallel electrical connections is zero or is substantially zero.

12. The method according to claim 8, further comprising utilizing the first coil or the second coil as a current transformer, in particular a current transformer without core.

13. The method according to claim 8, further comprising determining which of the parallel electrical connections is defective based on the first voltage or the second voltage, wherein the first voltage induced in the first coil or the second voltage induced in the second coil in the vicinity of the defective electrical connection differs from zero or provides a variation that is larger than a predetermined value.

14. A system for determining a defective electrical connection
comprising a first coil and a second coil on or in an integrated circuit, wherein the first coil is located between or adjacent to a first electrical connection and a second electrical connection, and the second coil is located between or adjacent to the second electrical connection and a third electrical connection, and the first electrical connection, the second electrical connection and the third electrical connection are arranged in parallel,
comprising a device for determining a defective electrical connection among the first electrical connection and the second electrical connection, wherein the device is arranged
for determining a current change in the first electrical connection or in the second electrical connection via a first voltage that is induced in the first coil,
for determining a current change in the second electrical connection or in the third electrical connection via a second voltage that is induced in the second coil, and
for determining which of the parallel electrical connections is defective based on the first voltage and the second voltage.

15. The system according to claim 14, wherein the device is arranged for determining which of the parallel electrical connections is defective based on the first voltage or the second voltage, wherein the first voltage induced in the first coil or the second voltage induced in the second coil in the vicinity of the defective electrical connection differs from zero or provides a variation that is larger than a predetermined value.

16. A system for determining a defective electrical connection to an integrated circuit comprising
a first coil and a second coil, wherein the first coil is located between or adjacent to a first electrical connection and a second electrical connection, and the second coil is located between or adjacent to the second electrical connection and a third electrical connection, and the first electrical connection, the second electrical connection and the third electrical connection are arranged in parallel,
means for determining a current change in the first electrical connection or in the second electrical connection via a first voltage that is induced in the first coil,
means for determining a current change in the second electrical connection or in the third electrical connection via a second voltage that is induced in the second coil, and
means for determining which of the several parallel electrical connections is defective based on the first voltage and the second voltage.

17. The system according to claim 16, comprising means for determining which of the parallel electrical connections is defective based on the first voltage or the second voltage, wherein the first voltage induced in the first coil or the second voltage induced in the second coil in the vicinity of the defective electrical connection differs from zero or provides a variation that is larger than a predetermined value.

18. A system for determining a defective electrical connection comprising a first coil and a second coil, wherein the first coil is located between or adjacent to a first electrical connection and a second electrical connection, and the second coil is located between or adjacent to the second electrical connection and a third electrical connection, and the first electrical connection, the second electrical connection and the third electrical connection are arranged in parallel, comprising a device for determining a defective electrical connection among the first electrical connection and the second electrical connection, wherein the device is arranged for determining a current change in the first electrical connection or in the second electrical connection via a first voltage that is induced in the first coil, for determining a current change in the second electrical connection or in the third electrical connection via a second voltage that is induced in the second coil, and for determining which of the parallel electrical connections is defective based on the first voltage and the second voltage.

19. The system according to claim 18, wherein the device is arranged for determining which of the electrical connections is defective based on the first voltage or the second voltage, wherein the first voltage induced in the first coil or the second voltage induced in the second coil in the vicinity of the defective electrical connection differs from zero or provides a variation that is larger than a predetermined value.

* * * * *